(12) United States Patent
Raghavan et al.

(10) Patent No.: US 7,471,135 B2
(45) Date of Patent: Dec. 30, 2008

(54) MULTIPLEXER CIRCUIT

(75) Inventors: Vijay Kumar Srinivasa Raghavan, Colorado Springs, CO (US); Ryan Tasuo Hirose, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 11/566,767

(22) Filed: Dec. 5, 2006

(65) Prior Publication Data

US 2008/0130375 A1 Jun. 5, 2008

(51) Int. Cl.
*H03K 17/16* (2006.01)
(52) U.S. Cl. .................. 327/408; 327/390; 327/589
(58) Field of Classification Search .......... 327/408, 327/390, 589
See application file for complete search history.

(56) References Cited

U.S. PATENT DOCUMENTS

| | | | | |
|---|---|---|---|---|
| 5,216,290 A | * | 6/1993 | Childers | 327/530 |
| 5,376,829 A | | 12/1994 | Rogers et al. | |
| 5,493,241 A | | 2/1996 | Landry et al. | |
| 5,598,114 A | | 1/1997 | Jamshidi | |
| 5,701,095 A | | 12/1997 | Ohsawa | |
| 5,844,840 A | * | 12/1998 | Le et al. | 365/185.23 |
| 5,982,220 A | | 11/1999 | Kim | |
| 6,078,513 A | * | 6/2000 | Ong et al. | 365/49.15 |
| 6,137,340 A | | 10/2000 | Goodell et al. | |
| 6,194,950 B1 | | 2/2001 | Kibar et al. | |
| 6,211,722 B1 | | 4/2001 | Mattia et al. | |
| 6,239,646 B1 | | 5/2001 | Navabi et al. | |
| 6,404,237 B1 | * | 6/2002 | Mathew et al. | 326/113 |
| 6,486,712 B1 | | 11/2002 | Landry et al. | |
| 6,563,367 B1 | * | 5/2003 | Lee | 327/390 |
| 6,636,077 B1 | | 10/2003 | Chang et al. | |
| 6,650,167 B1 | | 11/2003 | Benzer et al. | |
| 6,696,880 B2 | * | 2/2004 | Pan et al. | 327/390 |
| 6,819,141 B1 | | 11/2004 | Qi et al. | |
| 6,853,233 B1 | * | 2/2005 | Terletzki et al. | 327/333 |
| 6,879,191 B2 | * | 4/2005 | Davis | 327/112 |
| 6,956,411 B1 | * | 10/2005 | Holloway | 327/94 |
| 7,030,684 B2 | * | 4/2006 | Kim | 327/536 |
| 2002/0175740 A1 | | 11/2002 | Ruegg et al. | |
| 2004/0100947 A1 | | 5/2004 | Masaki | |
| 2005/0077951 A1 | | 4/2005 | Kim | |

OTHER PUBLICATIONS

International Search Report & Written Opinion, PCT/US2007/085838, mailed Jun. 18, 2008.

* cited by examiner

*Primary Examiner*—Kenneth B. Wells

(57) ABSTRACT

A multiplexer circuit provided herein includes a plurality of pass devices coupled in parallel between a power supply and a ground supply. According to one embodiment, each pass device may include a first pair of transistors, which is coupled in series between the power supply and the ground supply, and a second pair of transistors, which is coupled to the first pair of transistors for controlling a current passed there through. In general, the second pair of transistors may be configured for increasing the amount of current passed through the first pair of transistors. For example, the second pair of transistors may utilize a bootstrapping effect to increase a pair of control voltages supplied to the gate terminals of the first pair of transistors. The increased control voltages function to over-drive the gate terminals of the first pair of transistors, thereby increasing the amount of current passed there through. A memory device comprising the multiplexer circuit and method for operating the multiplexer circuit are also provided herein.

18 Claims, 3 Drawing Sheets

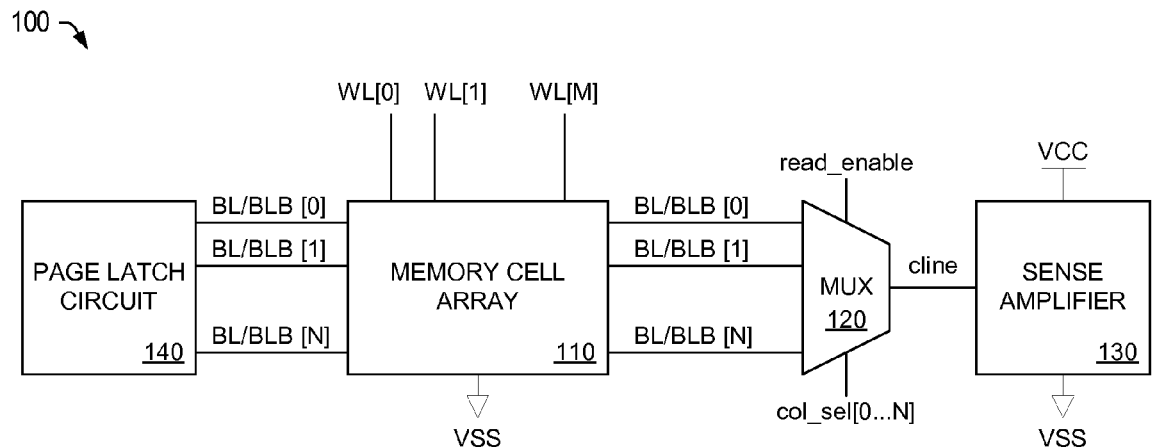
**FIG. 1
(prior art)**
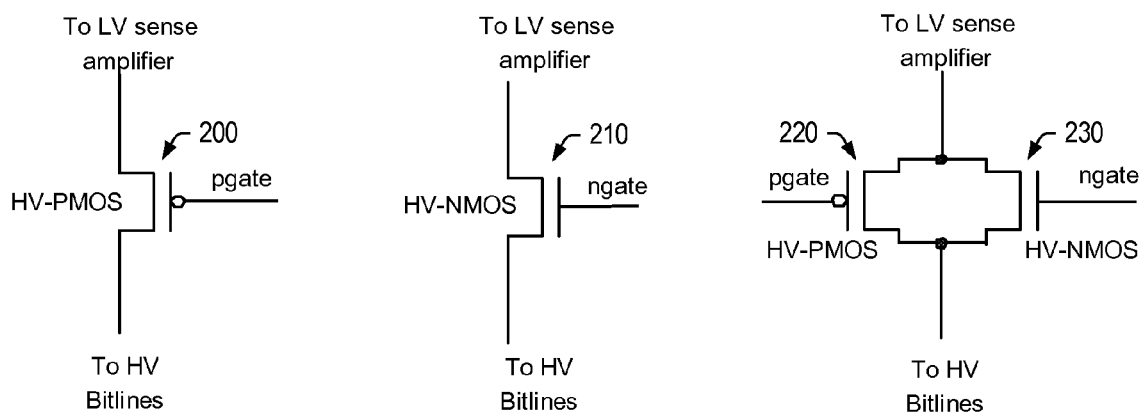
**FIG. 2a
(prior art)**
**FIG. 2b
(prior art)**
**FIG. 2c
(prior art)**

MULTIPLEXER CIRCUIT

BACKGROUND OF THE INVENTION

1. Field of the Invention

This invention relates to analog circuit designs and, more particularly, to a multiplexer circuit whose high speed operation is unaffected by power supply headroom limitations. More specifically, a multiplexer circuit in accordance with the present invention utilizes bootstrapping to provide high speed operation in the presence of low power supply. The multiplexer circuit is also leakage tolerant and provides high voltage isolation without added circuit complexity.

2. Description of the Related Art

The following descriptions and examples are given as background only.

Multiplexers are logic devices that select between two or more inputs to be transferred to an output. In general, multiplexers may be used within substantially any analog circuit or digital logic block that requires selection between two or more signals. For example, a multiplexer may be included within a clocking network for selecting between two or more clock signals, which may be generated outside of the clocking network (e.g., by an external oscillator coupled to the clocking network) or within the clocking network (e.g., by an internal phase shift apparatus, such as a phase lock loop, PLL, or delay lock loop, DLL). As such, the multiplexer may be configured for transferring a selected one of the clocking signals to the clocking network or a downstream circuit component.

In another example, a multiplexer may be configured for selecting between two or more data signals. For instance, a multiplexer included within a memory device may select between two or more bitline voltages generated during a read operation. FIG. 1 is a block diagram illustrating an exemplary memory device 100. As shown in FIG. 1, the memory device may include a memory cell array 110, a column multiplexer 120 and a sense amplifier 130. The memory cell array 110 may include a number of memory cells arranged in rows and columns. Access to the memory cell array is generally provided by connecting a wordline to each row of memory cells (denoted WL[0 . . . M]) and a bitline to each column of memory cells (denoted BL[0 . . . N]).

During read operations, one or more memory cells may be accessed by asserting the appropriate wordline and selecting one of the bitlines. As shown in FIG. 1, column multiplexer 120 may be coupled to each of the bitlines (BL[0 . . . N]). The column multiplexer is configured for generating read currents through select memory cell(s) by passing a relatively small read bias voltage (e.g., about 1 V) onto the selected bitline. For example, a column select signal (one of col_sel [0 . . . N]) may be supplied to column multiplexer 120 for coupling the selected bitline to sense amplifier 130. In doing so, a current path through the column multiplexer and selected memory cell may be established from the power supply voltage (VCC) on the sense amplifier side to a ground potential (VSS) on the memory cell side. The read currents generated there through may be "sensed" or read by sense amplifier 130 before the output of sense amplifier 130 is passed on to downstream circuitry.

Column multiplexers typically include a number of pass devices, each coupled between the sense amplifier and a different one of the bitlines. In some cases, the pass devices must be able to withstand relatively high voltages. For example, non-volatile memory architectures require memory cell contents to be erased before they can be reprogrammed with new data. During program/erase operations, relatively high voltage biases (e.g., around +/−7V) are applied to the bitline(s) of select memory cell(s) from the high voltage page latch circuitry (140). Because the pass devices must tolerate these high voltage biases, they are often implemented with high voltage transistors having thick gate oxides and high threshold voltages ($V_T$).

Pass devices commonly used within column multiplexers are illustrated in FIG. 2. In most cases, a column multiplexer array may be implemented by coupling several of these pass devices in parallel (e.g., one pass device for every bitline in the memory cell array). In some cases, a pass device may include a single high voltage PMOS transistor (200, FIG. 2a) or a single high voltage NMOS transistor (210, FIG. 2b). In other cases, a pass device may include a pair of high voltage PMOS and NMOS transistors coupled in parallel (220, 230, FIG. 2c). During read operations, read currents are generated through select memory cell(s) by supplying a column select signal (e.g., col_sel[0 . . . N] and/or its complement) to the gate terminal(s) of the pass transistor(s) shown in FIGS. 2a-2c.

However, a problem arises when the pass devices of FIG. 2 are utilized in low voltage applications. For example, current trends within memory architecture design dictate that supply voltages be reduced to conserve power, improve reliability for small geometry devices, etc. In some cases, a power supply voltage of about 1.5V (or less) may be supplied to a low voltage sense amplifier and memory cell array. However, low power supply voltages provide the column multiplexer with very limited headroom, which can make it difficult for conventional column multiplexers to generate sufficient read currents.

For example, and as shown in FIG. 2, conventional column multiplexers include one or more high voltage devices having relatively high threshold voltages ($V_T$). As a result of limited power supply headroom, these high voltage devices have difficulty passing read bias voltages onto the bitlines to generate sufficient read currents. Essentially, the speed across the column multiplexer is degraded due to the high voltage pass devices and power supply headroom limitations. In some cases, the speed across the multiplexer may be improved by increasing the size of the high voltage pass device. However, an increase in size is rarely feasible or desirable due to the on-pitch nature of the column multiplexer.

Therefore, a need remains for an improved multiplexer design that may be used within low power applications. More specifically, a need remains for a multiplexer circuit, whose high-speed operation is unaffected by power supply headroom limitations. Although applicable to many analog circuit designs, a high-speed, leakage tolerant multiplexer circuit may be particularly useful as a column multiplexer in a variety of non-volatile memory architectures where the multiplexer can be turned off during high voltage operations.

SUMMARY OF THE INVENTION

The following description of various embodiments of multiplexer circuits, memory devices and methods is not to be construed in any way as limiting the subject matter of the appended claims.

According to one embodiment, a multiplexer circuit with high speed, low power, small area and high voltage isolation is provided herein. In general, the multiplexer circuit includes a plurality of pass devices coupled in parallel between a power supply and a ground supply. In some cases, the power supply may comprise a relatively low voltage (e.g., about 1.4V to about 1.9V, although the invention is not limited to this range). As such, the power supply may provide relatively little voltage headroom to the transistors included within the pass devices. However, the high speed operation provided by the improved multiplexer circuit is substantially unaffected by power supply headroom limitations. As described in more detail below, the improved multiplexer circuit utilizes bootstrapping to maintain high speed operation, and therefore, consumes relatively little area compared to conventional multiplexer circuits, which increase operating speed by increasing the size of the transistors included within the pass devices.

In one embodiment, each of the pass devices included within the improved multiplexer circuit may include a first pair of transistors and a second pair of transistors. In general, the first pair of transistors may be coupled in series between the power supply and the ground supply, and may be configured for passing a current there through. The first pair of transistors may be referred to herein as "pass transistors." In some cases, the first pair of transistors may be implemented with a combination of low voltage and high voltage NMOS transistors.

As used herein, a "low voltage transistor" may be defined as having a relatively thin gate oxide and a relatively low threshold voltage ranging, e.g., between about 0.4V and about 0.6V. Likewise, a "high voltage transistor" may be defined as having a relatively thick gate oxide and a relatively high threshold voltage ranging, e.g., between about 0.8V and about 1.2V. As described in more detail below, the low voltage pass transistor may be used as the multiplexer select device, while the high voltage pass transistor is used for high voltage isolation.

In one embodiment, a second pair of transistors may be coupled to the pass transistors for increasing the amount of current passed there through. In some cases, the second pair of transistors may be implemented with native NMOS transistors. As used herein, a "native transistor" is one whose threshold voltage is substantially equal to about 0V. By coupling native transistors to the gate terminals of the pass transistors, the current generated through the pass transistors may be increased by a bootstrapping effect on each of the two pass transistors.

For example, each of the native transistors may have a gate terminal coupled to the power supply, and a source terminal coupled to a gate terminal of a respective one of the pass transistors. During operation of the multiplexer, a pair of control signals may be supplied to drain terminals of the native transistors for increasing a pair of control voltages generated at their respective source terminals. Because native transistors have threshold voltages, which are substantially equal to about 0V, the pair of control voltages supplied to the gate terminals of the pass transistors may initially approximate the power supply voltage. However, as current begins to flow through the pass transistors, voltages generated at the source terminals of the pass transistors begin to rise. The rising voltages generated at the source terminals of the pass transistors are "bootstrapped" or "capacitively coupled" to the control voltages generated (by the native transistors) at the gate terminals of the pass transistors. This bootstrapping effect increases the control voltages supplied to the gate terminals of the pass transistors, thereby overdriving those transistors and increasing the amount of current flowing there through. The increased current enables the improved multiplexer circuit to obtain high operating speeds, even in the presence of limited power supply headroom. In addition, bootstrapping reduces the amount of area consumed by the multiplexer by allowing the pass device to use relatively smaller sized transistors.

In some embodiments, each of the pass devices may further include a discharge circuit, which is coupled in parallel with the pass transistors. When activated by a discharge signal, the discharge circuit may be configured for discharging the voltage to ground after it is sensed (e.g., by a downstream sense amplifier). In one example, the discharge circuit may include a low voltage NMOS transistor having a gate terminal coupled for receiving the discharge signal, a drain terminal coupled to a drain terminal of the low voltage pass transistor, and a source terminal coupled to the ground supply. After the current is sensed, the discharge signal is supplied to the discharge circuit for discharging the voltage at the drain of the low voltage NMOS transistor to ground. This ensures that bootstrapping will occur at the start of each new read cycle.

In some embodiments, each of the pass devices may further include a disable circuit, which is coupled between the ground supply and an intermediate node arranged between the pass transistors. When activated by a de-select signal, the disable circuit may be configured for coupling the intermediate node to ground. In one example, the disable circuit may include a low voltage NMOS transistor having a gate terminal coupled for receiving the de-select signal, a drain terminal coupled to the intermediate node and a source terminal coupled to the ground supply. When activated by the de-select signal, the disable circuit may reduce current leakage (caused, e.g., by any leaky circuit connected to the source of the high voltage pass transistor) through unselected pass devices by coupling the intermediate node and, hence the source of the high voltage transistor, to ground.

According to another embodiment, a memory device comprising the improved multiplexer circuit is provided herein. For example, the memory device may generally include a memory cell array and a plurality of bitlines, which are coupled to the memory cell array and configured for receiving read currents from one or more selected memory cells within the array. As such, the improved multiplexer circuit described above may be coupled to the plurality of bitlines for passing the read currents to a sense amplifier circuit of the memory device.

As noted above, the multiplexer circuit may include a plurality of pass devices, each coupled between the sense amplifier circuit and a different one of the bitlines. In addition, each pass device may include a pair of pass transistors and a pair of native transistors. When incorporated within a memory device, the pass transistors may be coupled in series between the sense amplifier circuit and a respective one of the bitlines. When enabled by a pair of control signals, the pass transistors may be configured for passing a read current supplied to the respective one of the bitlines. In one embodiment, the pair of pass transistors may include a low voltage pass transistor coupled in series with a high voltage pass transistor.

The native transistors may be configured for receiving the control signals and for generating a pair of control voltages in response thereto. For example, each of the native transistors may be coupled for passing a respective control voltage to a different one of the pair of pass transistors. More specifically, a first one of the native transistors may be coupled for receiving a first one of the control signals, and in response, for supplying a first one of the control voltages to a gate terminal of the low voltage pass transistor. In some cases, the first control signal may be a column select signal. Likewise, a second one of the native transistors may be coupled for receiving a second one of the control signals, and in response, for supplying a second one of the control voltages to a gate terminal of the high voltage pass transistor. In some cases, the second control signal may be a read enable (or high voltage isolation) signal.

As explained above, each of the native transistors may provide a bootstrapping effect to a respective one of the pass transistors. For example, the native transistors may be configured for supplying the first and second control voltages to the gate terminals of the pass transistors upon receiving asserted column select and read enable signals. Once current begins to flow through the pass transistors, rising voltages at the source terminals of the pass transistors may "bootstrap" or capacitively couple to the first and second control voltages supplied to the gate terminals of the pass transistors. This bootstrap effect increases the control voltages, overdrives the gate terminals of the pass transistors and increases the amount of read current and read voltage passed there through.

In some embodiments, each of the pass devices may also include a disable circuit, as noted above. In one example, the disable circuit may include an inverter and a low voltage NMOS transistor. In some cases, a drain terminal of the low voltage NMOS transistor may be coupled to an intermediate node arranged between the pair of pass transistors; a source terminal of the low voltage NMOS transistor may be coupled to ground; and a gate terminal of the low voltage NMOS transistor may be coupled for receiving an inverted version of the column select signal. As such, the disable circuit may be configured for coupling the intermediate node to ground upon receiving a de-asserted column select signal. This would reduce current leakage through unselected memory cells by grounding the source terminals of the unselected pass devices, and hence, grounding the bitlines.

In some embodiments, each of the pass devices may also include a discharge circuit, as noted above. In one example, the discharge circuit may include a low voltage NMOS transistor whose drain terminal is coupled to a drain terminal of the low voltage pass transistor, source terminal is coupled to ground, and gate terminal is coupled for receiving the discharge signal. After the read current is sensed and latched by the sense amplifier, a discharge signal may be supplied to the discharge circuit for discharging the voltage on the drain of the pass transistors to ground. Discharging the drain terminals of the pass transistors after every read cycle ensures that bootstrapping will occur at the start of each new read cycle.

In some embodiments, each of the pass devices may also include a means for isolating the low voltage transistors contained therein from high voltage biases present on the bitlines during write operations. In one example, a relatively high, negative read enable signal may be supplied to the drain terminal of the second native transistor during a write operation to the memory cell array. Since the gate terminal of the second native transistor is tied to VCC, a relatively high negative control voltage is supplied to the gate terminal of the high voltage pass transistor. This deactivates the high voltage pass transistor and isolates the remaining transistors within the pass device from the high voltage biases present on the bitlines.

According to another embodiment, a method for operating the improved multiplexer circuit is also provided herein. As noted above, the improved multiplexer circuit may include a plurality of pass devices, each comprising a pair of serially-coupled pass transistors and a pair of native transistors. As described in more detail below, each of the native transistors may be coupled to a different one of the serially-coupled pass transistors for controlling a current passed there through.

In some cases, the method may include supplying an asserted read enable signal to a first one of the native transistors to activate a first one of the pass transistors by supplying a first control voltage thereto. In addition, the method may include supplying an asserted column select signal to a second one of the native transistors to activate a second one of the pass transistors by supplying a second control voltage thereto. In general, activation enables current to pass through the pair of serially-coupled pass transistors. However, by supplying the read enable and column select signals to the native transistors, a bootstrapping effect is provided for increasing the first and second control voltages supplied to the pass transistors, and as a result, for increasing the amount of current passed there through.

In some cases, one or more method steps may be performed prior to the step of supplying an asserted column select signal. For example, the method may include supplying a de-asserted column select signal to a disable circuit of unselected ones of the plurality of pass devices prior to the step of supplying an asserted column select signal. The de-asserted column select signal may be used, for example, to ground the pass transistors and reduce current leakage through unselected memory cells. In some cases, one or more method steps may be performed after the step of supplying an asserted column select signal. For example, the method may include reading memory cell contents by sensing the increased current passed through the first and second pass transistors, and once the memory cell contents are read, discharging the pass device drain voltages to ground before the steps of supplying may be subsequently repeated.

BRIEF DESCRIPTION OF THE DRAWINGS

Other objects and advantages of the invention will become apparent upon reading the following detailed description and upon reference to the accompanying drawings in which:

FIG. 1 is a block diagram of an exemplary memory device comprising a memory cell array, a column multiplexer and a sense amplifier;

FIG. 2a is a circuit diagram illustrating a first embodiment of a conventional pass device that may be used within the column multiplexer of FIG. 1;

FIG. 2b is a circuit diagram illustrating a second embodiment of a conventional pass device that may be used within the column multiplexer of FIG. 1;

FIG. 2c is a circuit diagram illustrating a third embodiment of a conventional pass device that may be used within the column multiplexer of FIG. 1;

Figure 3:
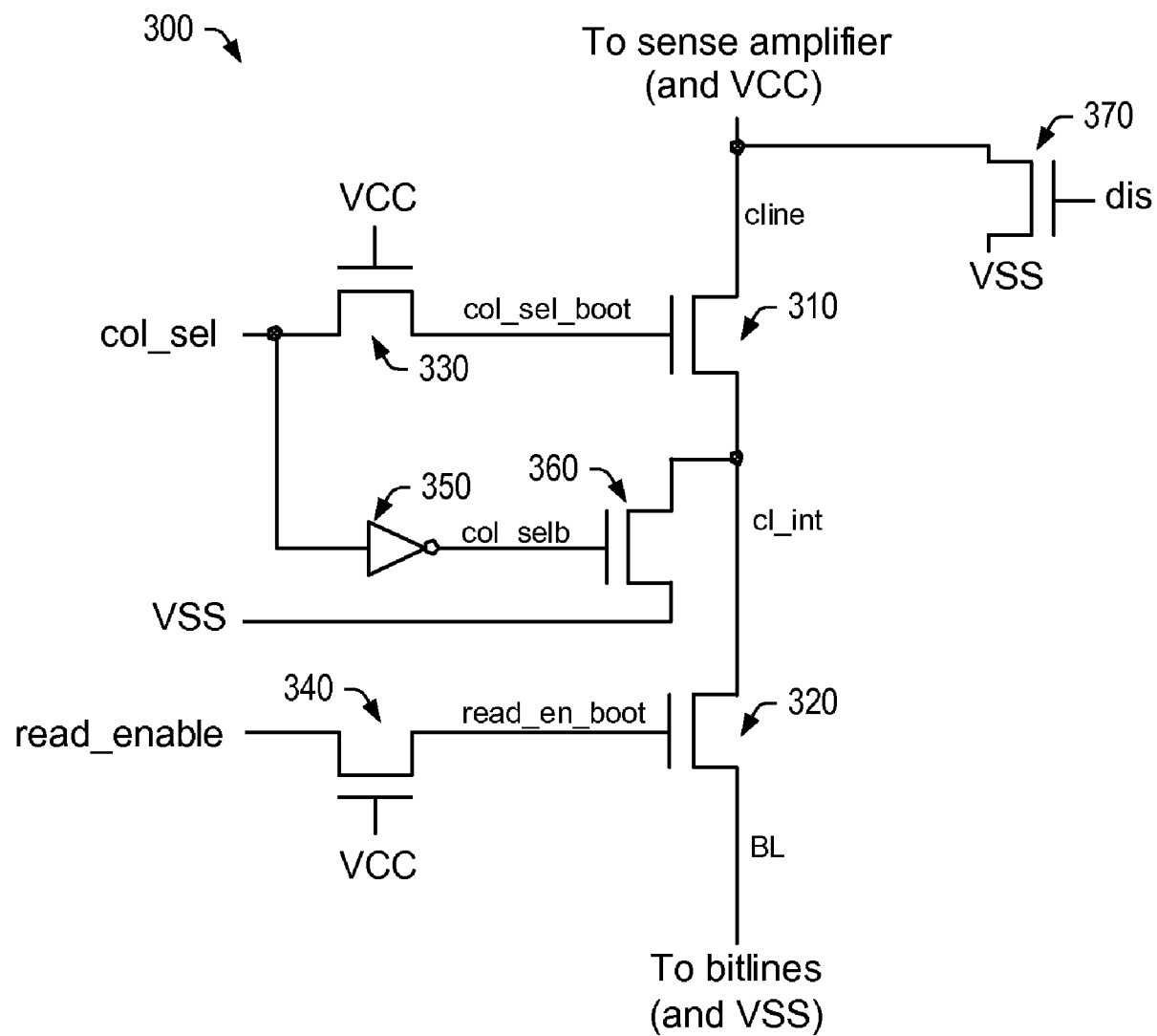
FIG. 3 is a circuit diagram illustrating an improved pass device that may be used within the column multiplexer of FIG. 1, according to one embodiment of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Column multiplexers are used within memory devices to access particular memory cells during read operations. For example, column multiplexers are used to generate read currents through select memory cells by passing read bias voltages onto corresponding bitlines. In most cases, the read bias voltages may be relatively small (e.g., around 1 V for SONOS memory architecture). However, column multiplexers used within non-volatile memory devices must also be able to withstand the relatively high voltage biases (e.g., about 7V for SONOS memory), which are supplied to the bitlines from the high voltage page latch circuitry during non-volatile program/erase operations. Conventional multiplexer designs tend to address this problem by using one or more thick oxide devices (i.e., high $V_T$ devices) within the pass devices of the multiplexer circuit. Unfortunately, transistors with high voltage thresholds have difficulty generating sufficient read currents in the presence of low power supplies (e.g., about 1.5V and below). As a result, the speed across the column multiplexer is significantly degraded during read operations. Also, the amount of read bias voltage that the multiplexer can pass through to the bitlines is significantly degraded, which slows down read speeds.

FIG. 3 illustrates one embodiment of an improved pass device for use in a multiplexer circuit. As described in more detail below, the pass device shown in FIG. 3 improves upon conventional pass devices by maintaining high speed operation, even in the presence of limited power supply headroom (e.g., when supplied with about 1.5V or less). Because high speed operation is maintained without increasing the size of the transistors used therein, the improved pass device also consumes less area than conventional devices. In light of the description presented below, one skilled in the art will recognize that the improved pass device provides other advantages, in addition to high speed and low area.

For example, current leakage through unselected memory cells may be eliminated by disabling the pass devices associated with unselected bitlines and connecting the bitlines to ground. In addition, means are provided for isolating the low voltage circuitry from the high voltage biases supplied to the bitlines during non-volatile program/erase operations. Thus, the improved pass device shown in FIG. 3 may be used to form a high speed, low power and small area multiplexer circuit, which does not suffer from power supply headroom limitations and provides the high voltage isolation necessary to withstand high voltages supplied to the bitlines during non-volatile program/erase operations.

Detailed operation of the improved pass device is described below, as if it were included within a column multiplexer of a memory device, and more specifically, a column multiplexer of a non-volatile memory device. In one embodiment, the improved pass device may be incorporated within a column multiplexer of a Flash or EEPROM memory device of a SONOS, floating gate or any other memory architecture.

As noted above, a multiplexer circuit may be implemented by coupling a plurality of pass devices in parallel. If incorporated within a column multiplexer of a memory device, each pass device may be coupled between a sense amplifier (e.g., sense amplifier 130 of FIG. 1) and a different bitline (e.g., bitlines BL[0:N] of FIG. 1) of a memory cell array (e.g., memory cell array 110 of FIG. 1). During read operations, a current path through a particular pass device is established from a power supply node (e.g., VCC) on the sense amp side to ground (e.g., VSS) through a selected memory cell and the bitline associated therewith.

In order to provide high speed operation, which is unaffected by power supply headroom limitations, sufficient analog read bias voltage (limited only by technology reliability considerations) must be passed to the bitlines to get maximum read memory cell current. Also, to improve read speed, the current path through the multiplexer needs to be a low impedance path. The improved pass device achieves this, without increasing the size of the transistors used therein, by including a combination of low voltage, high voltage and native devices. As described in more detail below, the native devices provide a double bootstrapping effect, which increases the amount of current flowing along the current path established through the pass transistors. The bootstrapping effect, therefore, enables the pass device to meet stringent high speed requirements without increasing its area consumption.

As shown in FIG. 3, an improved pass device (300) in accordance with the present invention may generally include a pair of pass transistors (310, 320) and a pair of native transistors (330, 340). In the particular embodiment shown, the pair of pass transistors includes a low voltage device (310) coupled in series with a high voltage device (320). As described in more detail below, the low voltage pass device serves as the column select device and the high voltage pass device helps in high voltage isolation during program/erase operations.

Through their connection to the sense amplifier and bitlines, the serially-coupled pass transistors provide a current path between the power supply (on the sense amp side) and ground (on the bitline/memory cell side). As noted above, additional current paths may be formed by coupling additional pass devices (300) in parallel, or in other words, by coupling additional pass devices between the sense amplifier and a different one of the bitlines. In one embodiment, the pass transistors may be implemented with n-type metal oxide semiconductor (NMOS) transistors. However, one skilled in the art will recognize how alternative process technologies may be used, in other embodiments of the invention.

In general, native transistors 330 and 340 are coupled to pass transistors 310 and 320 for controlling the amount of current passed there through. For example, native transistor 330 is coupled to a gate terminal of the low voltage pass transistor (310) for supplying a first control voltage (e.g., col_sel_boot) thereto. Likewise, native transistor 340 is coupled to a gate terminal of the high voltage pass transistor (320) for supplying a second control voltage (e.g., read_en_boot) thereto. As described in more detail below, the control voltages are based, at least in part, on a level of the control signals (e.g., col_sel and read_enable) supplied to the native transistors and the type of transistors used.

In one embodiment, native transistors 330 and 340 are implemented with native NMOS transistors, as shown in FIG. 3. For example, a drain terminal of native transistor 330 is coupled for receiving the first control signal (col_sel), while its source is coupled for supplying the first control voltage (col_sel_boot) to the gate terminal of low voltage pass transistor 310. Native transistor 340 is similarly coupled to high voltage pass transistor 320. For example, the drain terminal of native transistor 340 is coupled for receiving the second control signal (read_enable), while its source is coupled for supplying the second control voltage (read_en_boot) to the gate terminal of high voltage pass transistor 320. Because the gate terminals of native transistors 330 and 340 are connected to the power supply rail (e.g., VCC), the transistors are always "on". However, the control voltages (col_sel_boot and read_en_boot) supplied to pass transistors 310 and 320 will differ depending on the level of the control signals (col_sel and read_enable) supplied to native transistor 330 and 340. Exemplary control voltages are described in more detail below in reference to the timing diagram of FIG. 4.

Before proceeding, it is worthwhile to define what is meant by low voltage, high voltage and native devices, as these terms are used throughout this disclosure. In general, the terms "low voltage," "high voltage," and "native" refer to transistor threshold voltage characteristics, which may be set by the thickness of the gate oxide and/or the presence or absence of ions implanted under the gate oxide (i.e., in the channel region). For example, "high voltage devices" are typically formed with thick gate oxides, which enable the device to withstand high voltages (e.g., voltages above VCC and below VSS) across its gate oxide or drain-source. On the other hand, "low voltage devices" are formed with substantially thinner gate oxides, which often break down in the presence of high voltages above and below the power supply rails. Because of their thinner gate oxides, low voltage devices have substantially lower threshold voltages ($V_T$) than high voltage devices. This means that low voltage devices may be activated or "turned on" by substantially lower gate voltages.

Low voltage and high voltage devices are typically formed by adjusting the magnitude of the transistor threshold voltage ($V_T$) during semiconductor fabrication. For example, an ion implantation technique, referred to herein as a "threshold adjust implantation," may be performed by implanting boron, phosphorus or arsenic ions into the regions under the gate oxide (e.g., within the channel region) before the source/drain regions of the transistor are formed. The implantation of boron causes a positive shift in the threshold voltage, while phosphorus or arsenic implantation causes a negative shift.

In some cases, a threshold adjust implantation may be used to form low voltage transistors, which exhibit threshold voltage ($V_T$) magnitudes within a range of about 0.4V to about 0.6V. In other cases, a threshold adjust implantation may be used to form high voltage transistors, which exhibit threshold voltage ($V_T$) magnitudes within a range of about 0.8V to about 1.2V. Alternative $V_T$ magnitudes may be realized by altering various process parameters (e.g., dopant concentrations) during the threshold adjust implantation.

A transistor is said to be "native" if no surface enhancement, depletion or threshold adjust implantation steps are performed during fabrication of the device. In other words, the channel region of a native transistor is formed directly on the surface of the well without performing an ion implantation or diffusion after well formation. In some cases, the native or unimplanted threshold voltage of an NMOS device may range between about −0.2V and about +0.2V. In a preferred embodiment, a native NMOS device may exhibit a threshold voltage ($V_T$) substantially equal to 0V. As used herein, "substantially equal to 0V" means that the threshold voltage may be approximately equal to 0V, or may be slightly greater or less than 0V by as much as +/−0.2V.

A "high voltage native device" is a device that is high voltage in nature (i.e., has a thick gate oxide to withstand high voltages), but has a threshold voltage ($V_T$) substantially equal to 0V. In one embodiment, native transistors 330 and 340 are implemented with high voltage native devices. The use of native transistors (which have zero threshold voltages) enables the col_sel_boot and read_en_boot nodes to get pre-charged to VCC before bootstrapping starts. However, native transistor 330 may not be high voltage in all embodiments of the invention. For example, native transistor 330 may be a low voltage native device, in some embodiments. However, native transistor 340 must be high voltage to withstand the high negative read_enable voltage supplied thereto during program/erase (for isolation purposes).

During read operations, a read current is generated through a selected memory cell by asserting the column select (col_sel) and read enable (read_enable) signals supplied to native transistors 330 and 340 of a corresponding pass device. This pre-charges the col_sel_boot and read_en_boot nodes to VCC. The read current, which flows through pass transistors 310 and 320 of the pass device, is increased by coupling native transistors 330 and 340 to the gate terminals of the pass transistors. In other words, native transistors 330 and 340 utilize bootstrapping to increase the gate voltage supplied to pass transistors 310 and 320. As described in more detail below, the bootstrapping effect provided by native transistors 330 and 340 over-drives the gates of pass transistors 310 and 320, thereby increasing the amount of read voltage (and thus, read current) flowing there through.

Figure 4:
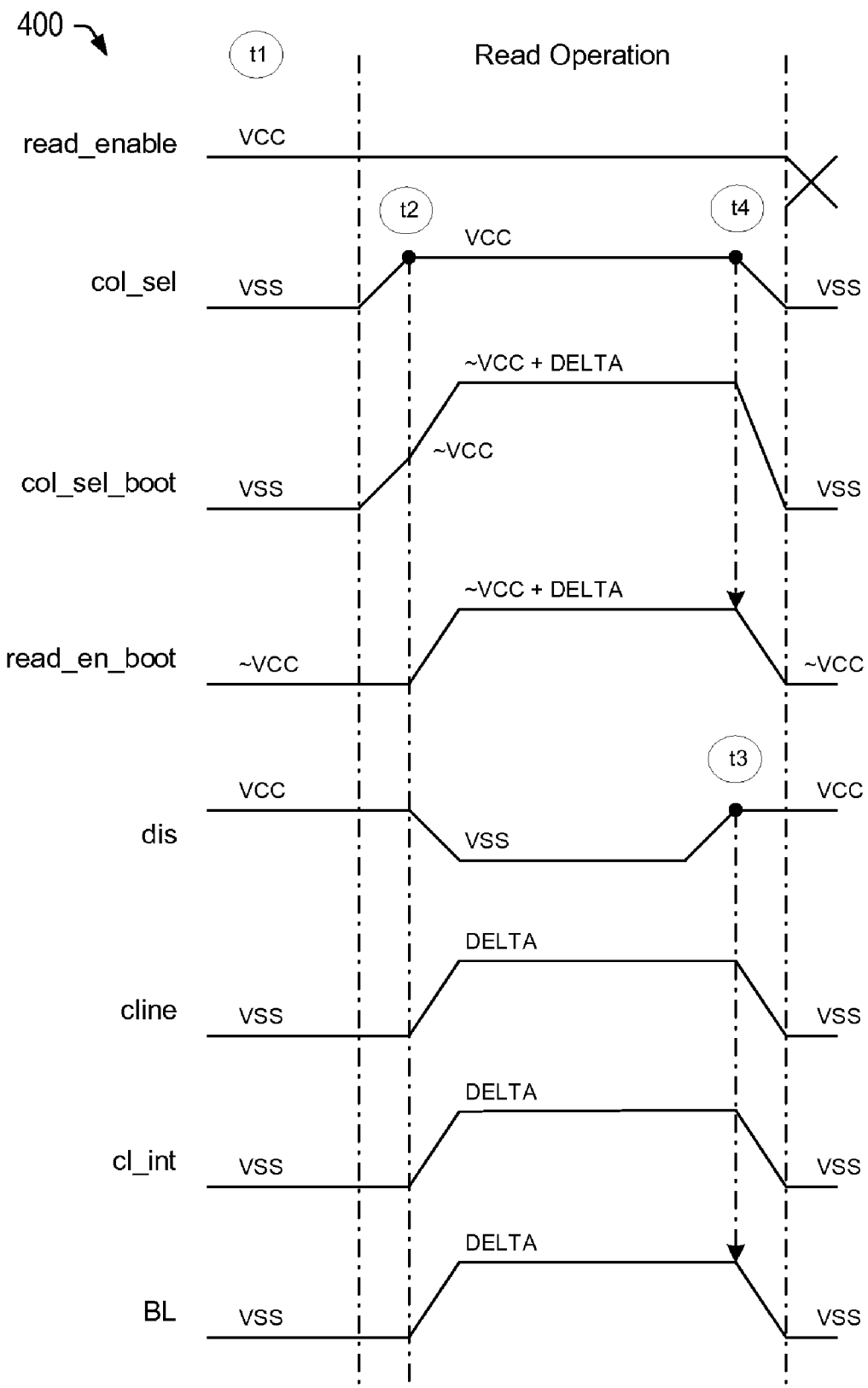
FIG. 4 is a timing diagram illustrating exemplary read timing characteristics of the pass device of FIG. 3, according to one embodiment of the invention.

FIG. 4 is a timing diagram (400) illustrating the above-mentioned bootstrapping effect. More specifically, FIG. 4 illustrates the timing and magnitudes of control signals supplied to, and resultant voltage levels generated within, a selected pass device (300) during a read operation. Therefore, the timing diagram shown in FIG. 4 may be used to illustrate at least one method for operating a multiplexer circuit including the improved pass device shown in FIG. 3.

At the start of a read cycle (e.g., at time t1), the read enable signal is asserted and the column select signal is de-asserted for all pass devices. For example, read_enable is driven to the power supply (VCC) and the col_sel signal is driven to ground (VSS). By driving the col_sel signal to VSS, the col_sel_boot control voltage is driven to VSS through native transistor 330. This deactivates pass transistor 310. However, driving the read_enable signal to VCC pre-charges the read_en_boot control voltage to a voltage level close to VCC through native transistor 340. This activates pass transistor 320. Because the threshold voltage of a native device may not be exactly equal to 0V, the read_en_boot voltage may not be exactly equal to VCC. Therefore, and as used herein, "close to" VCC means that the voltage may be equal to VCC, or slightly less than VCC by as much as 0.2V.

In some cases, all bitline voltages (BL) may be driven to VSS at the start of a read cycle. For example, pass device 300 may include a circuit, which is specifically configured for reducing current leakage through the memory cell array. Such a circuit will be referred to herein as a "disable circuit," and may include an inverter 350 and a low voltage NMOS device 360, as shown in the embodiment of FIG. 3. Although a low voltage NMOS device is generally preferred (because it can be smaller than a high voltage device for a given strength of the device), disable transistor 360 may be implemented with a high voltage NMOS device, in alternative embodiments of the invention. One skilled in the art will recognize how alternative configurations of a disable circuit may be used to reduce current leakage in other embodiments of the invention.

In the illustrated embodiment, disable transistor 360 is coupled between ground (VSS) and an intermediate node (cl_int) arranged between pass transistors 310 and 320. The inverter is coupled for supplying an inverted version of the column select signal (col_selb) to the gate terminal of disable transistor 360. When the col_sel signal is driven to VSS, the inverter forwards a logic high col_selb voltage (e.g., VCC) to the gate terminal of disable transistor 360. This activates transistor 360 and pulls the intermediate node (cl_int) to ground, which in turn, brings the bitline voltage (BL) to ground. This enables the disable circuit to eliminate current leakage through all memory cells at the start of each read cycle. During a read cycle, the disable circuits within unselected pass devices may continue to eliminate current leakage through unselected memory cells. In doing so, the disable circuit may be used to help meet stringent standby current specifications. However, the disable circuit may not be used in all embodiments of the invention.

In some cases, the voltage presented to the sense amplifier (at node cline) may be driven to VSS before the start of each new read cycle. For example, pass device 300 may include a circuit, which is specifically configured for discharging the node cline and the bitlines at the end of every read cycle. Such a circuit will be referred to herein as a "discharge circuit," and may include a low voltage NMOS device 370, as shown in the embodiment of FIG. 3. Although a low voltage NMOS device is generally preferred (because it can be smaller than a high voltage device for a given strength of the device), discharge transistor 370 may be implemented with a high voltage NMOS device, in alternative embodiments of the invention. One skilled in the art will recognize how alternative configurations of a discharge circuit may be used for discharging the bitlines in other embodiments of the invention.

In the illustrated embodiment, discharge transistor 370 is coupled between the voltage presented to the sense amplifier (at node cline) and ground (VSS). At the end of each read cycle, the discharge signal (dis) supplied to the gate terminal of discharge signal 370 is driven to VCC for activating this device and pulling node cline to ground. As described in more detail below, the discharge circuit ensures that nodes col_sel_boot and read_en_boot will always get a bootstrapping effect at the start of each new read cycle.

When a bitline is selected for reading the contents of a particular memory cell, the column select signal (col_sel) supplied to a particular pass device is driven to VCC, as shown in FIG. 4. Because transistor 330 is a native device with a threshold voltage close to 0V, the control voltage (col_sel_boot) supplied to the gate terminal of pass transistor 310 is charged close to VCC (i.e., ~VCC). This activates or "turns on" pass transistor 310. Once the column select signal settles at VCC (e.g., at time t2), a path to VCC is established to the pass device through the sense amplifier side. Whenever a current path to VCC is established, the discharge signal (dis) is driven to ground (VSS) to deactivate the discharge circuit.

Since the selected bitline (BL) has a path to VSS through its connection to the memory cell, and node cline has a path to VCC through the sense amplifier, current starts to flow through pass devices 310 and 320 and node BL starts to rise from VSS. If BL rises by, say delta volts, node read_en_boot will rise to about~VCC+delta, due to the bootstrapping effect across pass transistor 320. This also leads to the cut-off of native device 340. For example, bootstrapping occurs as a result of capacitive coupling across the gate and source terminals of pass transistor 320. As shown in FIG. 3, the BL voltage is bootstrapped or capacitively coupled to the gate of pass transistor 320, which increases the control voltage (read_en_boot) supplied thereto. This overdrives the gate of pass transistor 320 and enables the BL voltage to rise higher than it would have risen, if the gate of pass transistor 320 were simply tied to VCC.

The rise in BL voltage also causes nodes cl_int and cline to rise. For example, the voltage increase at the intermediate node (cl_int) causes the col_sel_boot control voltage to rise to~VCC+delta, due to a similar bootstrapping effect across pass transistor 310. This also leads to the cut-off of native device 330. Once the voltage presented to the sense amplifier (at node cline) settles, memory cell contents may be read by sensing the amount of current (or voltage, depending on sense amp design) on the selected bitline.

Since the gates of pass transistors 310 and 320 are both overdriven during the read operation, the BL voltage is able to rise much higher than it would have risen without the double bootstrapping effect described above. This provides significantly more read current through an erased memory cell, and hence, better read/erase sense differential margin and speed. In other words, during a read of an erased cell, the current through the memory cell increases with increased bitline voltage. Due to the bootstrapping effect, the voltage passed from the sense amplifier side to the bitlines is higher (than without bootstrapping) and hence the read current through an erase cell is higher. In one embodiment, pass device 300 may be configured for passing approximately 100% more erase read current than possible with conventional pass devices. This translates into a significant improvement in erase read speed (e.g., about 100% over conventional pass devices).

At the end of the read cycle (i.e., at time t3), the discharge signal is driven to VCC to activate the discharge circuit and drive the bitline to ground. At the same time, the current path to VCC at the sense amplifier side is turned OFF. In one embodiment, the discharge signal (dis) is controlled by sense amplifier timing signals. For example, once the read data has been sensed and latched, the discharge signal supplied to discharge transistor 370 is driven to VCC to discharge the bitlines (and thus, the voltages on nodes cline, cl_int and BL) back to VSS. By discharging the bitlines after every read access, the discharge circuit makes sure that nodes col_sel_boot and read_en_boot always get a bootstrapping effect at the start of each new read cycle.

For example, in the case of successive reads on the same column (i.e., the same col_sel signal is "ON" for successive read cycles), there is a possibility that nodes col_sel_boot and read_en_boot will discharge from~VCC+delta back to VCC (given enough time) during the course of a read operation (due to subthreshold leakage at nodes col_sel_boot and read_en_boot). This would degrade the voltage level on the bitline and result in substantially lower erase read currents. To prevent this, node cline is always brought back to VSS through discharge transistor 370 after every read access. When node cline goes to VSS, nodes cl_int and BL also go to VSS. Therefore, even if successive read accesses are performed on the same column, discharge transistor 370 ensures that nodes cline, cl_int and BL will go to VSS and then charge back up towards VCC through the devices in the sense amplifier. In other words, the discharge circuit maintains high erase read currents by ensuring that nodes col_sel_boot and read_en_boot always get a bootstrapping effect at the start of each new read cycle.

As the discharge signal is driven to VCC (or some time soon thereafter), the bitline accessed during the read cycle is deselected by driving the col_sel signal to ground (e.g., at time t4). This quickly discharges the col_sel_boot node to VSS through native transistor 330 and turns off pass transistor 310. Driving the col_sel to VSS also causes inverter 350 to supply a logic high col_selb voltage (e.g., VCC) to disable transistor 360, which activates this device and brings nodes cl_int and BL back to VSS. This brings node read_en_boot from~VCC+delta back to VCC, due to the bootstrapping effect across pass transistor 320.

During non-volatile write operations, a relatively high voltage (e.g., about +/−7 V for SONOS memory) is supplied to the bitline corresponding to the memory cell to be written. In order to isolate the sense amplifier side of the column multiplexer (which includes low voltage devices 310, 360, 370 and the low voltage devices in the sense amplifer), the read_enable signal supplied to the column multiplexer is driven to a high, negative voltage (e.g., about −7V, in one embodiment). This turns off the high voltage pass transistors (320) and protects the low voltage devices (310, 360, 370 and devices in the sense amplifier) from the high program/erase voltages seen on the bitline.

It should now be clear that the pass device shown in FIG. 3 provides many advantages over conventional pass devices. First of all, pass device 300 may be used to form a multiplexer, which does not suffer from power supply headroom issues. As noted above, native transistors 330 and 340 provide a double bootstrapping effect to pass transistors 310 and 320. The double bootstrapping effect enables higher bias voltages to be passed onto the bitlines during read operations to obtain higher read erase currents, even at low power supply voltages (e.g., about 1.5V and below). As a result, sense differential margins and read speeds are improved.

In addition to increased speed, pass device 300 may be used to form a leakage tolerant multiplexer. For example, the discharge circuit ensures that bootstrapping will occur at the start of every read cycle. Also, the disable circuit described above may be used to eliminate current leakage through unselected memory cells before and during read operations. The discharge circuit described above may also be used to reduce current leakage during read operations.

Bootstrapping also enables the improved multiplexer circuit to be smaller in terms of area. For example, when presented with limited power supply headroom, conventional multiplexers often increase the size of the transistors used within the pass device to obtain higher read erase currents, and thus, increased read speeds. However, the improved multiplexer utilizes bootstrapping to address power supply headroom limitations. For example, native transistors 330 and 340 are added to the pass device to boot the control voltages supplied to pass transistors 310 and 320, thereby increasing read erase currents and improving read speeds. Because the transistors used to create the bootstrapping effect can be smaller sized devices, the improved pass device may be used to fabricate a multiplexer circuit that consumes relatively little area.

In addition to the advantages presented above, the improved pass device provides high isolation during non-volatile write operations without any additional circuit complexity. For example, the low voltage transistors (e.g., 310, 360 and 370) within the pass device and the low voltage devices within the sense amplifier are shielded from high voltage bitlines during non-volatile write operations by supplying a high, negative read_enable signal to native transistor 340. This avoids the additional circuitry typically needed to provide high voltage isolation in conventional multiplexer circuits. For example, conventional multiplexers without two serial pass devices will need input control signals that are driven by level shifter circuits (which are slow and complicated) in order to be able to provide column enable signals and HV isolation.

It will be appreciated to those skilled in the art having the benefit of this disclosure that this invention is believed to provide a multiplexer circuit with high speed, low power, small area and high voltage isolation. More specifically, the invention provides a multiplexer circuit that utilizes bootstrapping to increase read currents and improve read speeds. Further modifications and alternative embodiments of various aspects of the invention will be apparent to those skilled in the art in view of this description. For example, the pass transistors described herein may be implemented with process technologies and memory architectures other than those specifically mentioned herein. It is intended, therefore, that the following claims be interpreted to embrace all such modifications and changes and, accordingly, the specification and drawings are to be regarded in an illustrative rather than a restrictive sense.

What is claimed is:

1. A multiplexer circuit comprising a plurality of pass devices coupled in parallel between a power supply and a ground supply, each pass device comprising:

a first pair of transistors, comprising a low voltage pass transistor coupled in series with a high voltage pass transistor between the power supply and the ground supply, wherein the first pair of transistors are configured for passing a current there through; and a second pair of native transistors coupled to gate terminals of the first pair of transistors for increasing the current by increasing a pair of voltages supplied to the first pair of transistors in response to a pair of control signals applied to the second pair of transistors; and a discharge circuit coupled in parallel with the first pair of transistors between the power supply and ground, wherein when activated by a discharge signal, the discharge circuit is configured for discharging a drain terminal of the low voltage pass transistor to ground.

2. The multiplexer circuit as recited in claim 1, wherein the power supply comprises a relatively low voltage of about 1.4 V to about 1.9 V.

3. The multiplexer circuit as recited in claim 1, wherein gate terminals of the native transistors are coupled to the power supply.

4. The multiplexer circuit as recited in claim 1, wherein each of the native transistors comprises a drain terminal coupled to a respective one of the control signals and a source terminal coupled to a gate terminal of a respective one of the pass transistors, and wherein assertion of both control signals increases the current passed through the pass transistors by increasing a gate voltage supplied to the pass transistors.

5. The multiplexer circuit as recited in claim 1, wherein the discharge circuit comprises a low voltage discharge transistor having a gate terminal coupled for receiving the discharge signal, a drain terminal coupled to the drain terminal of the low voltage pass transistor, and a source terminal coupled to the ground supply.

6. The multiplexer circuit as recited in claim 1, wherein each pass device further comprises a disable circuit coupled between the ground supply and an intermediate node arranged between the first pair of transistors, and wherein when activated by a de-select signal, the disable circuit is configured for coupling the intermediate node to ground.

7. The multiplexer circuit as recited in claim 6, wherein the disable circuit comprises a low voltage disable transistor having a gate terminal coupled for receiving the de-select signal, a drain terminal coupled to the intermediate node and a source terminal coupled to the ground supply.

8. A memory device, comprising:

a memory cell array;

a plurality of bitlines coupled to the memory cell array, wherein during a read cycle, at least one of the bitlines is configured for receiving a read current from a selected one of the memory cells within the array;

a multiplexer circuit coupled to the plurality of bitlines for passing the read current to a sense amplifier circuit of the memory device, wherein the multiplexer circuit comprises a plurality of pass devices, each coupled between the sense amplifier circuit and a different one of the bitlines, and wherein each pass device comprises:

a pair of pass transistors coupled in series between the sense amplifier circuit and a respective one of the bitlines, wherein when enabled by a pair of control signals, the pass transistors are configured for passing the read current supplied to the at least one bitline from the selected one of the memory cells;

a pair of native transistors, each coupled to a different one of the pair of pass transistors for supplying a pair of control voltages to the pass transistors for increasing the read current passed therethrough; and a discharge transistor coupled in parallel with the pair of pass transistors for discharging the at least one bitline at the end of each read cycle.

9. The memory device as recited in claim 8, wherein the pair of pass transistors comprise a low voltage pass transistor coupled in series with a high voltage pass transistor.

10. The memory device as recited in claim 9, wherein a first one of the native transistors is coupled for receiving a first one of the control signals, and in response, for supplying a first one of the control voltages to a gate terminal of the low voltage pass transistor, the first control signal being a column select signal.

11. The memory device as recited in claim 10, wherein a second one of the native transistors is coupled for receiving a second one of the control signals, and in response, for supplying a second one of the control voltages to a gate terminal of the high voltage pass transistor, the second control signal being a read enable signal.

12. The memory device as recited in claim 11, wherein upon receiving asserted column select and read enable signals, the native transistors are configured for increasing the first and second control voltages supplied to the pass transistors, thereby increasing the read current passed through the pass transistors.

13. The memory device as recited in claim 11, wherein each pass device further comprises a disable circuit including an inverter and a low voltage transistor, wherein the low voltage transistor comprises a drain terminal coupled to an intermediate node arranged between the pair of pass transistors, a source terminal coupled to ground and a gate terminal coupled for receiving an inverted version of the column select signal.

14. The memory device as recited in claim 13, wherein upon receiving a de-asserted column select signal, the disable circuit is configured for coupling the intermediate node to ground, thereby reducing current leakage associated with unselected memory columns by grounding unselected bitlines through the multiplexer circuit.

15. The memory device as recited in claim 11, wherein upon receiving a high, negative read enable signal, the second native transistor is configured for de-activating the high voltage pass transistor, thereby isolating remaining transistors within the pass device and the sense amplifier circuit from the selected bitline.

16. A method for operating a multiplexer circuit comprising a plurality of pass devices, wherein each pass device comprises a pair of serially-coupled pass transistors and a pair of native transistors, wherein each of the native transistors is coupled to a different one of the serially-coupled pass transistors for controlling a current passed there through, and wherein the method comprises:
  supplying an asserted read enable signal to a first one of the native transistors to activate a first one of the pass transistors by supplying a first control voltage thereto;
  supplying an asserted column select signal to a second one of the native transistors to activate a second one of the pass transistors by supplying a second control voltage thereto, wherein said activation enables current to pass through the pair of serially-coupled pass transistors;
  wherein by supplying the read enable and column select signals to the native transistors, the method is configured for increasing the first and second control voltages supplied to the pass transistors through a bootstrapping effect, and as a result, for increasing the amount of current passed therethrough;
  reading memory cell contents by sensing the increased current passed through the first and second pass transistors; and
  once the memory cell contents are read. discharging a voltage associated with the second pass transistor to around before the steps of supplying are subsequently repeated.

17. The method as recited in claim 16, wherein the steps of supplying are performed for a selected one of the plurality of pass devices.

18. The method as recited in claim 17, wherein prior to the step of supplying an asserted column select signal, the method comprises supplying a de-asserted column select signal to a disable circuit of unselected ones of the plurality of pass devices for grounding the pass transistors contained therein and reducing current leakage there through.

\* \* \* \* \*